United States Patent [19]
Houston

[11] Patent Number: 5,615,162
[45] Date of Patent: Mar. 25, 1997

[54] SELECTIVE POWER TO MEMORY

[75] Inventor: Theodore W. Houston, Richardson, Tex.

[73] Assignee: Texas Instruments Incorporated, Dallas, Tex.

[21] Appl. No.: 368,568

[22] Filed: Jan. 4, 1995

[51] Int. Cl.$^6$ .................................................. G11C 5/14
[52] U.S. Cl. ........................ 365/226; 365/228; 365/229
[58] Field of Search .................................. 365/226, 227, 365/228, 229, 189.08, 230.03

[56] References Cited

U.S. PATENT DOCUMENTS

| | | | |
|---|---|---|---|
| 4,937,789 | 6/1990 | Matsubara | 365/226 |
| 5,140,557 | 8/1992 | Yoshida | 365/227 |
| 5,262,998 | 11/1993 | Mnich et al. | 365/222 |
| 5,365,487 | 11/1994 | Patel et al. | 365/222 |
| 5,410,713 | 4/1995 | White et al. | 365/229 |

FOREIGN PATENT DOCUMENTS

| | | | |
|---|---|---|---|
| 0609497 | 8/1994 | European Pat. Off. | 365/229 |
| 2737087 | 3/1979 | Germany | 365/227 |
| 58-215785 | 12/1983 | Japan | 365/229 |

*Primary Examiner*—Tan T. Nguyen
*Attorney, Agent, or Firm*—Carlton H. Hoel; W. James Brady, III; Richard L. Donaldson

[57] ABSTRACT

A memory cell array (12, 22) or selected blocks (32–36) thereof may be made inactive to reduce leakage current and power consumption. A switch (14, 26, 40–44, 116, 134, 139) is coupled between the memory cell array (12, 22, 96–100, 112, 132) or segmented memory blocks (32–36) and the power supply. The switch (14, 16, 40–44) are controlled to selectively connect the memory cell array (12, 22, 96–100, 112, 132) or blocks thereof (32–36) to the power supply according to the active, standby, or disabled operation states of the memory. The periphery circuitry (114) may also be powered separately from the memory cell array (112) to further reduce leakage currents and power consumption.

26 Claims, 3 Drawing Sheets

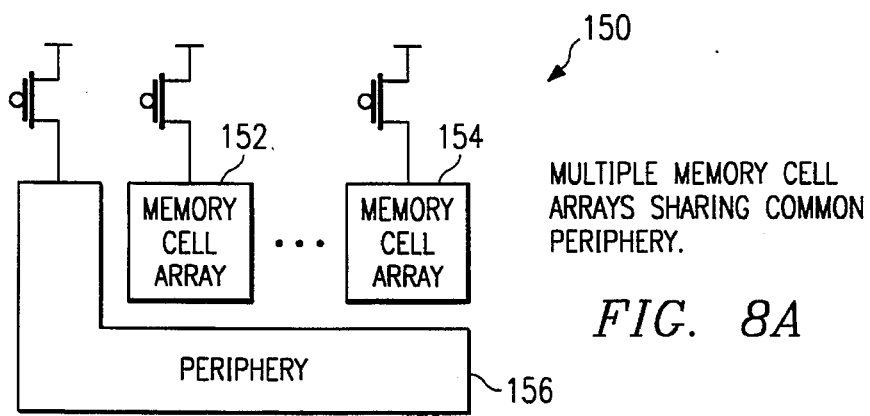
FIG. 8A  MULTIPLE MEMORY CELL ARRAYS SHARING COMMON PERIPHERY.
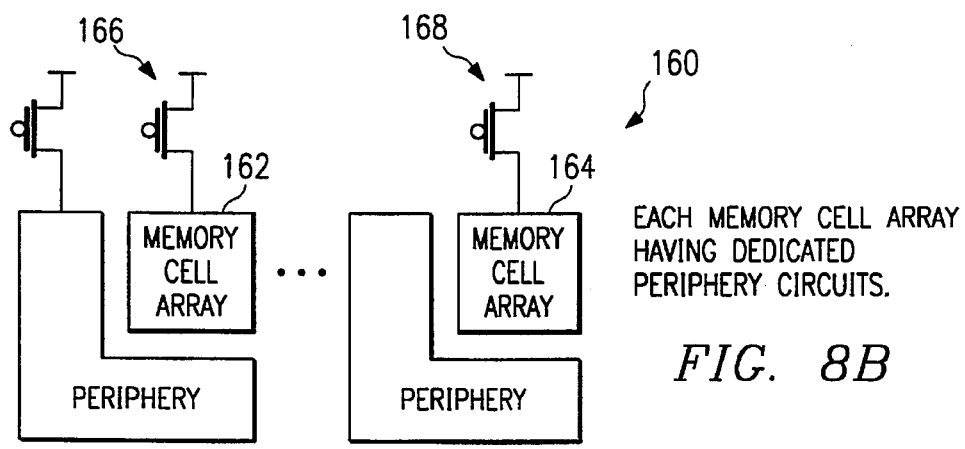
FIG. 8B  EACH MEMORY CELL ARRAY HAVING DEDICATED PERIPHERY CIRCUITS.
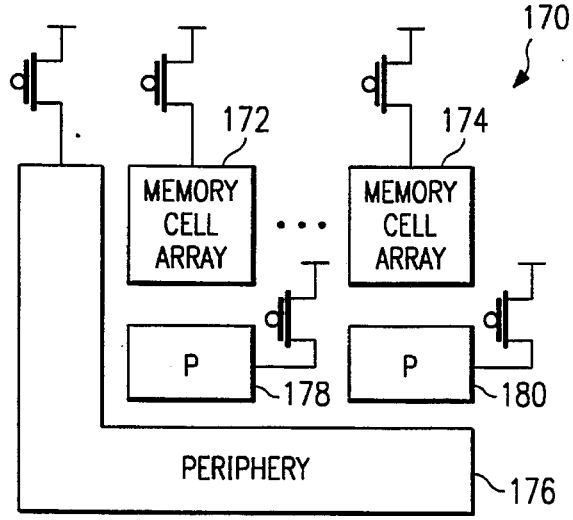
FIG. 8C  MIXTURE OF COMMON AND DEDICATED PERIPHERY CIRCUITS.
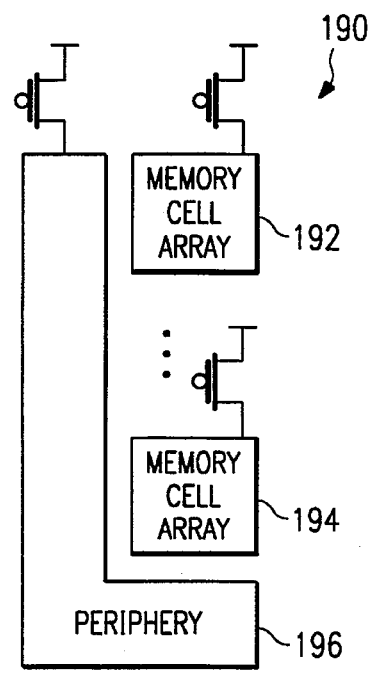
FIG. 8D  DIVISION/ORGANIZATION CAN BE BY ROW AS WELL AS BY COLUMN.

1

SELECTIVE POWER TO MEMORY

TECHNICAL FIELD OF THE INVENTION

This invention relates in general to the field of semiconductor circuits, More particularly, the present invention relates to a method and apparatus for providing power selectively to memory cell arrays,

BACKGROUND OF THE INVENTION

Leakage current, or photo current, in a semiconductor circuit is often the result of exposure to a high level burst of ionizing radiation. The leakage current causes a reduction in the supply voltage, also referred to as rail span collapse, which may in turn cause unpredictable behavior in circuit performance. For example, data stored in registers and latches may become corrupt. In particular, cache memory, integrated circuits with on-chip memory, or other memory arrays can be significant sources of leakage current for a computer system. The memory arrays are implemented in memory devices such as SRAMs, DRAMs, and ROMs that are widely used in electronic circuits.

Semiconductor circuit engineers have attempted to resolve the leakage current problem by designing improved transistor structures, improved manufacturing methods, or devising ways to detect transient dose conditions. However, these designs and methods entail fundamental changes in the transistor structure and manufacturing methods, for example, and therefore may require expensive retooling and/or reconfiguration.

Low power consumption in memory devices has always been a goal of semiconductor circuit engineers. Even when a memory array is inactive, power is still being consumed because of leakage currents. The effects of leakage currents become more pronounced as transistor threshold voltages are decreased in low supply voltage applications. Reduced power consumption is especially important in those circuit applications that use portable power supplies, such as consumer electronic products. Furthermore, as the size of memory in systems multiplies, the power consumed by the memory during standby becomes increasingly significant.

Accordingly, there arises a desire to reduce leakage current and power consumption in memory devices and improve its performance.

SUMMARY OF THE INVENTION

In accordance with the present invention, apparatus and method to selectively supply power to a memory array is provided which eliminates or substantially reduces the disadvantages associated with prior memory devices.

In one aspect of the invention, a switch is coupled between the memory array and the power supply for the memory array. The switch can be turned on or off either to connect or disconnect the memory array from the power supply in response to a selected state of a control signal.

In another aspect of the invention, a computer system includes a memory device having a memory array, and a microprocessor coupled to the memory device. A switch is coupled between the memory array and a power supply. The switch connects or disconnects the memory array from the power supply in response to a standby signal and a data retention signal generated by the microprocessor.

In yet another aspect of the invention, a method for reducing power consumption and leakage current in a memory array in a computer system is provided. The method includes the steps of dividing the memory array into a plurality of memory blocks, and determining memory usage in terms of the number of memory blocks needed and whether data retention is required for those memory blocks. The microprocessor of the computer system then generates a standby signal for each of the plurality of memory blocks indicative of an active/inactive status of the respective memory blocks, and a data retention signal for each of the plurality of memory blocks indicative of whether data stored in the respective memory blocks are to be retained. Power is then selectively provided to those memory blocks having a standby signal indicating an active status, or a data retention signal indicating data retention is required.

BRIEF DESCRIPTION OF THE DRAWINGS

For a better understanding of the present invention, reference may be made to the accompanying drawings, in which:

FIGS. 8a–8d are block diagrams showing numerous exemplary memory cell array and periphery circuitry arrangements.

DETAILED DESCRIPTION OF THE INVENTION

The preferred embodiment of the present invention and its advantages are best understood by referring to FIGS. 1–9 of the drawings, like numerals being used for like and corresponding parts of the various drawings.

Figure 1:
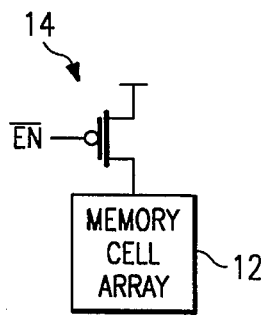
FIG. 1 is a schematic diagram of an embodiment of the invention.

FIG. 1 shows a memory cell array 12 of a memory device. In a memory cell array 12, only a small percentage of cells typically switch at any one time or are active. This is especially true for large memory cell arrays. Therefore, the current needed by the active cells is small relative to the total number of potential conductive paths from one power supply to the other power supply or to ground. A switch or p-channel transistor 14 is coupled between the power supply and the memory cell array 12. The memory cell array 12 may be turned off or disabled by the p-channel transistor 14, which is gated by an enable/disable signal, $\overline{EN}$. Configured in this manner, when the enable signal $\overline{EN}$ is low, the memory cell array 12 is active and ready for read and write operations; when the enable signal $\overline{EN}$ is high, the path from the power supply to the memory cell array 12 is cut off. The leakage current in the memory cell array 12 when the circuit is inactive is therefore greatly reduced or effectively eliminated.

Figure 2:
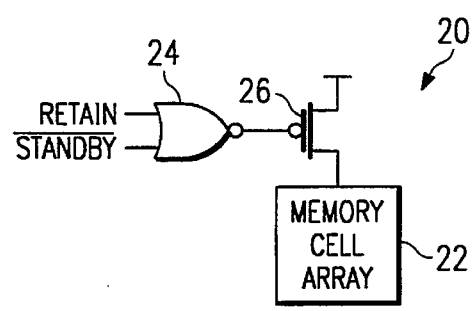
FIG. 2 is another schematic diagram of an embodiment of the invention with a memory retention feature.

Referring to FIG. 2, two control signals, $\overline{\text{STANDBY}}$ and RETAIN, may be used to selectively provide power, reduced power, or no power to a memory cell array 22. FIG. 2 shows one embodiment of logic to combine the information on whether or not the memory is in standby and whether or not memory is to be retained when in standby and using the combined information to control power to the memory cell array. The control signals, $\overline{\text{STANDBY}}$ and RETAIN, are received by a NOR gate 26, the output of which is provided to the gate of a p-channel transistor 26 coupled between the memory cell array 22 and the supply voltage. Therefore, whenever the memory cell array 22 is not in standby ($\overline{\text{STANDBY}}$ high) or when the data stored therein is to be retained, (RETAIN high), the p-channel transistor 26 is on, allowing power to reach the memory cell array 22. However, if the memory cell array 22 is in standby and no data retention is needed, the output of the NOR gate 24 is high, and the transistor 26 is turned off. This circuit configuration may be used in those applications where data retention may not be necessary, such as in an on-chip memory or a cache memory of a processor or microprocessor. The generation of control signals such as the data retention signal is generally known in the art. The data retention signal may be generated based on knowledge of the nature of data stored in the memory cell array 22, and may be highly dependent on circuit applications. In addition, other control signals and/or combinational logic may be used to selectively switch on and off power to the memory cell array 22. The logic circuits may be on- or off-chip with respect to the memory array. The techniques and circuit configurations shown and described hereinafter are equally applicable to this memory cell array circuit 22.

Figure 3:
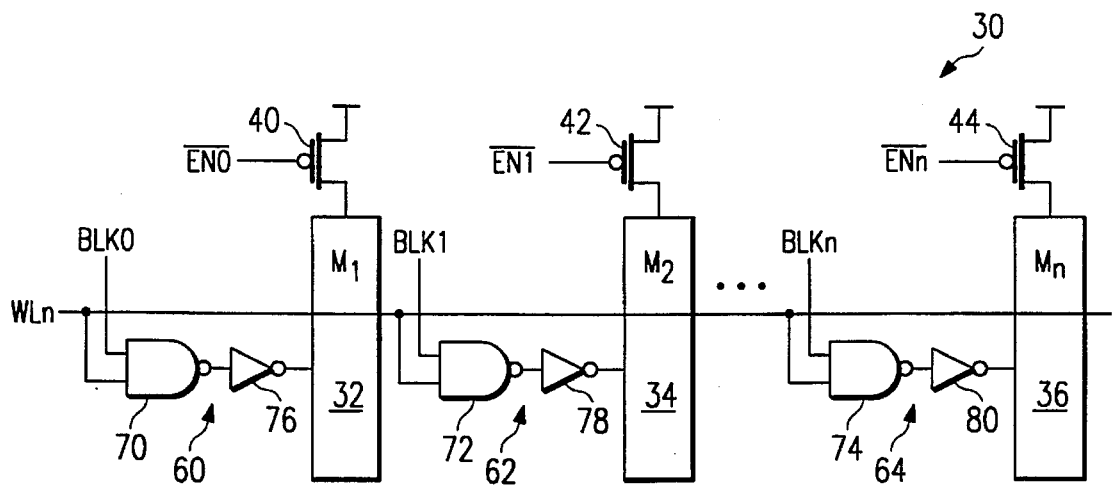
FIG. 3 is a schematic diagram of an embodiment of the invention with selected segmented memory power-up.

Referring to FIG. 3, a memory cell array 30 may be segmented into a number of memory blocks 32–36, with power selectively supplied thereto according to usage. Each memory block 32–36 is coupled to the power supply through a p-channel transistor 40–44, each of which is controlled by an enable signal, $\overline{\text{ENO}}$–$\overline{\text{ENn}}$. The enable signals may be generated from a retain data signal and a standby signal as in FIG. 2, or from other dynamic control or status signals. Alternatively, the enable signals may be set statically by the user or application program. A low power retain data signal may also be added as in FIG. 7, to be discussed below. Where more than one memory cell array is on the same chip, the switch to the power supply may be on-chip, or separate power supplies may be brought onto the chip to separately power the memory cell arrays. This is also true for a single memory cell array on the same chip with other circuitry. A global wordline, WLn, for selecting a particular row of memory cells in the memory cell array 30, is provided to logic circuits 60–64, comprised of NAND gates 70–74 connected to inverters 76–80. The NAND gates 70–74 perform the NAND function of the global wordline and respective block selection signals, BLKO–BLKn, provided to the input of the NAND gates 70–74. A subset of all the memory blocks 32–36 may be selected in this manner by setting the appropriate block selection signal(s) high. Furthermore, power to a subset of the memory blocks 32–36 may be selectively cut off by appropriately setting the active and standby signals. It may be seen that the memory cell array 30 may be divided in other ways also suitable to this method. In addition, other wordline segmentation configurations may also be used.

Constructed in this manner, only those memory cell arrays which are active or contain data requiring retention are supplied with power. Power consumption may be greatly reduced during most system operations. In addition, since the unselected blocks are no longer drawing power, the total amount of leakage current in the memory cell array is also reduced.

Figure 4:
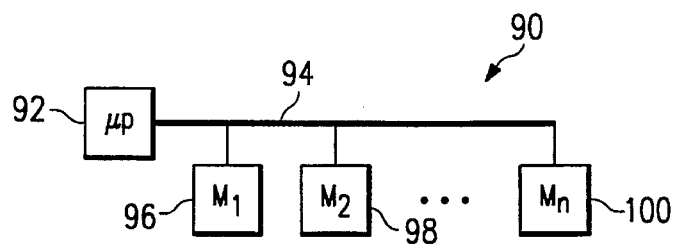
FIG. 4 is a block diagram of a microprocessor system with a plurality of memory cell arrays.

Referring to FIG. 4, a memory configuration in a microprocessor system 90 is shown. A microprocessor 92 is coupled to a bus 94 routed to a plurality of memory cell arrays or memory segments 96–100. The memory cell arrays or memory segments 96–100 may exist on the same semiconductor device as the microprocessor, or they may be off-chip. The bus 94, in addition to conveying conventional data and address information, may also carry memory enable or select control information. For example, the bus may carry a select signal to each memory 96–100 to selectively power up one or more of the memories. The select signal may be in the form of enable and/or data retention signals as described above to selectively put the memories 96–100 in the active, standby, or disabled state.

Alternatively, the select signal generated by the microprocessor 92 may be in the form of an enable address having a predetermined number of bits. Each memory 96–100 is assigned an enable address. The microprocessor 92 may generate the enable address and send it over the bus 94. The memories 96–100 or logic circuits associated therewith receive the enable address. In response to the enable address and its relationship with the assigned addresses of the memories, selected memories are powered up or disabled. For example, those memories having an enable address less than or equal to the received enable address are powered up, and those memories having enable addresses greater than the received enable address are disabled. On or off-chip switches may be used to controllably connect or disconnect the memories 96–100 to the supply voltage. A p-channel transistor as shown in FIG. 1, or an n-channel transistor and like circuits may be used as the switches. The assigned addresses of the memories may be hardwired or programmable, such as in an FPGA, an EPROM, a ROM, RAM, or with fuses, for example. The logic circuitry for performing the address decode or comparison function and the connecting/disconnecting switches are generally known in the art and is not described in detail herein.

Figure 5:
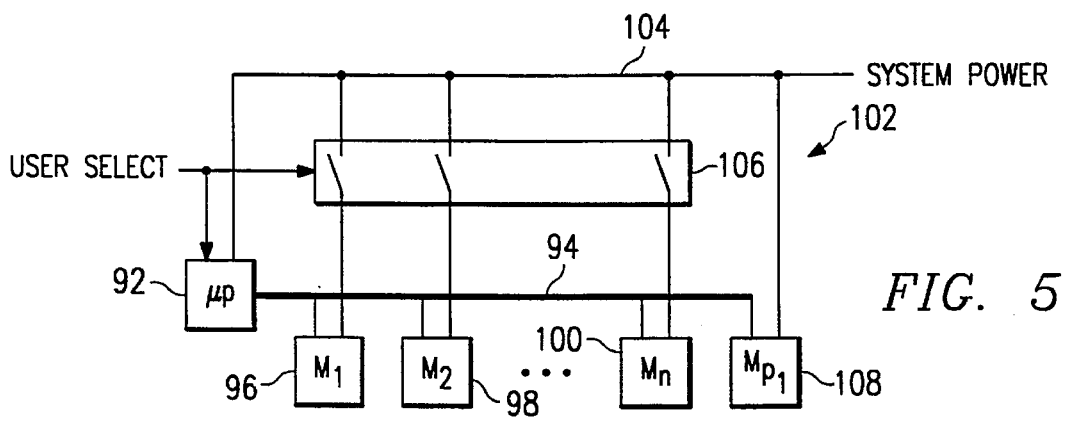
FIG. 5 is a schematic diagram of a microprocessor with user selectable memory cell arrays.

Referring to FIG. 5, an alternative memory configuration 102 is shown for memories 96–100. The memories 96–100 are coupled to a supply voltage 104 via respective switches 106. The switches 106 are individually controllable by a user select signal or by some mechanical means. The user select signal may be entered by a user and is indicative of the amount of memory to be enabled. The user select signal may also be generated by the microprocessor 92 upon receipt of some user input or application program specification indicative of the amount of memory desired or required. Similarly, the user select signal may include memory enable and/or data retention information as described above. Optionally, one or more memory cell array or segment 108 may be directly connected to the supply voltage 104, so that it is always enabled when the system is powered up.

Figure 6:
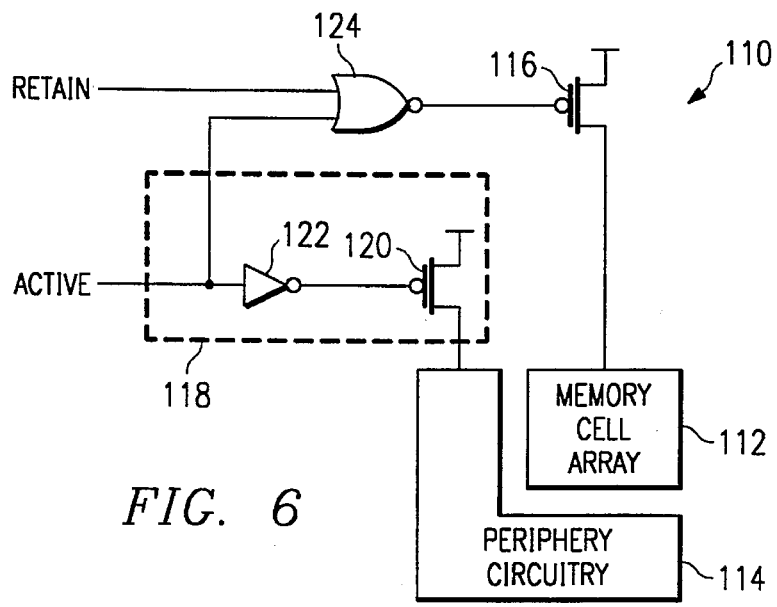
FIG. 6 is a schematic diagram of a memory cell array and periphery circuitry supply power control arrangement.

FIG. 6 is a schematic block diagram of circuitry 110 to selectively provide power independently to a memory cell array 112 and its periphery circuitry 114. It is understood in the art that the periphery circuitry 114 of a memory cell array 112 may include, but not limited to, precharge and timing circuitry, row decode circuitry, sense amplifiers, data latches, and column decode circuitry (not shown). The power to the memory cell array 112 is controlled by a switch or p-channel transistor 116, the operation of which is controlled by the RETAIN and ACTIVE signals combined by a NOR gate 124, such that if either signal is high, power is supplied to the memory cell array 112. The power to the periphery circuitry 114 may be optionally controlled by a logic circuit 118. The logic circuit 118 includes a switch or p-channel transistor 120, which is operated by an inverter 122 receiving the ACTIVE control signal.

Therefore, the periphery circuit 114 is supplied power whenever the memory is in the active state. The memory cell array 112 is supplied power when data retention is needed or the memory is in the active state. Constructed in this manner, the periphery circuitry 114 and the memory cell array 112 are powered separately, so that power consumption by either circuit is selectively controlled.

It is understood that different logic and different control signals may be used. For example, a standby signal may be used in place of the active signal with corresponding changes in the logic. Also a ready signal may replace the active signal. Further, the periphery circuitry may be associated with a plurality of memory cell arrays, to which the power may be controlled by different control signals and/or logic circuits. Some subset of periphery circuitry may be powered in conjunction with the memory cell array with other parts of the peripheral circuitry powered separately.

Figure 7:
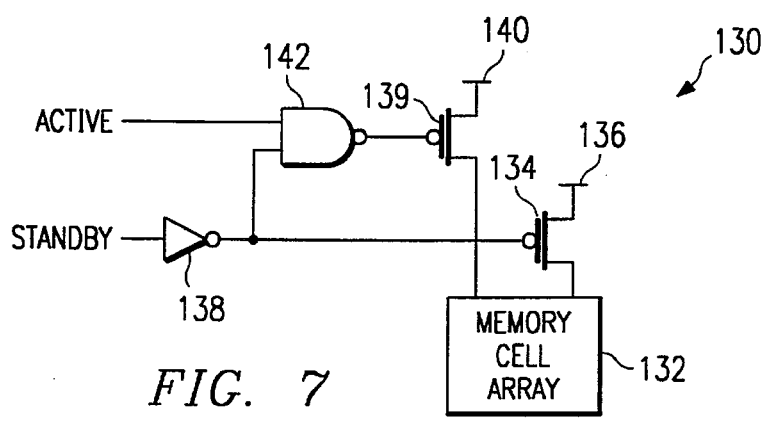
FIG. 7 is a schematic diagram of a memory cell array with selectable supply power levels for memory retention and active power.

It may be advantageous to define three states of operation for a memory cell array: active, standby, and disabled. When the memory cell array is active, it is ready for read and write operations, and data stored therein is retained. When the memory cell array is in standby, no memory access may be performed but is powered sufficiently to retain stored data. When the memory cell array is disabled, power supplied to it is turned off. Referring to FIG. 7, an alternative power control configuration 130 is shown. A memory cell array 132 is coupled to a p-channel transistor 134 acting as a power switch and is connected to a standby supply voltage 136. The p-channel transistor 134 is controlled by the STANDBY signal inverted by an inverter 138. The memory cell array 132 is further coupled to another switch or p-channel transistor 138, which is connected to an active supply voltage 140. The p-channel transistor 138 is controlled by the output of a NAND gate 142, which receives the ACTIVE signal and inverted STANDBY signal from the inverter 138. The active supply voltage 140 provides a sufficient voltage level for active memory operations and is at a higher voltage than the standby supply voltage 136. Constructed in this manner, power supply during the different states of operation in the memory cell array 132 is distinguished to reduce leakage currents and overall power consumption.

FIGS. 8a–d illustrates some possible memory cell array and periphery circuitry division or segmentation configurations 150, 160, 170, and 190, all of which are equally applicable in the present invention. Multiple memory cell arrays or memory segments 152 and 154 may share a common periphery circuitry 156; the memory cell arrays 162 and 164 may each have dedicated periphery circuitry and control circuits 166 and 168; the memory cell arrays 172 and 174 may have a combination of dedicated 178 and 180 and shared 176 periphery circuitry; and the memory cell arrays 192 and 194 segmentation and its periphery circuitry 196 may be by row as well as by column, which is shown in FIG. 3. The periphery circuitry may likewise be connected or disconnected to a supply voltage by a switch controlled by a signal from the microprocesser as illustrated in FIGS. 10A–D.

Figure 9:
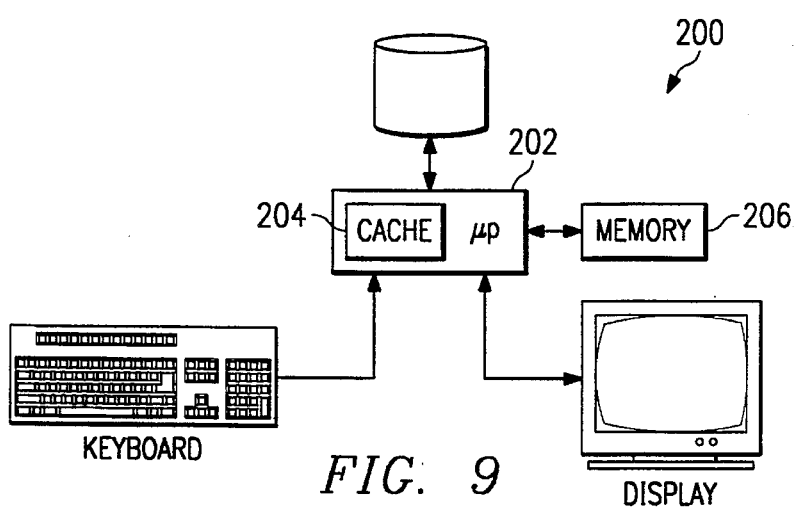
FIG. 9 is a block diagram of a computer system utilizing memory arrays constructed according to the teachings of the present invention.

FIG. 9 shows a typical computer system 200 to which the present invention is applicable. When the memory, on-chip cache memory 204 and/or off-chip memory devices 206, is constructed in the manner taught by the present invention, blocks of memory may be selectively powered up dependent on the memory usage demands of the microprocessor 202 and the application programs running therein. For example, if by some method of computation, application program specification, or user input, it is determined that only a subset of memory blocks is needed, then that subset of blocks' control signals would indicate an active status to allow connection of the memory blocks to the power supply. The control signals to the rest of the blocks in the memory would indicate their disabled or inactive status, and effectively disconnect them from the power supply or supply only sufficient voltage for data retention. The microprocessor and application programs then use the memory locations in the powered address space. For example, power may be selectively supplied in order of ascending address, and memory access limited to addresses 0 to n, where n is the highest powered address. Therefore, the amount of memory currently in active status may vary according to usage, and may be dynamically changed or anticipated. In addition, upon system power up, the memory cell array may be initialized to supply power to only a minimum number of active memory blocks in anticipation of more limited memory usage initially. A limited amount of additional or surplus memory may be enabled in anticipation of upcoming usage to avoid power up delay. A power savings is thus realized along with a drastic reduction in leakage current in those memory blocks. As the microprocessor's memory usage varies, the memory blocks would be selectively activated or inactivated by the active, standby, and other control signals accordingly.

It must be noted that although p-channel transistors have been shown in the drawing figures as the embodiment of switches controlling the power flow to the memory cell arrays and other circuitry, other comparable circuit elements or devices may be substituted therein. For example, n-channel transistors coupled between the circuits and ground, parallel n-channel and p-channel transistors, bipolar transistors and other circuit configurations as known in the art may be used to control the power flow to the memory cell arrays.

Although the present invention and its advantages have been described in detail, it should be understood that various changes, substitutions and alterations can be made therein without departing from the spirit and scope of the invention as defined by the appended claims.

What is claimed is:

1. A memory associated with a mircoprocessor comprising:

a memory cell array; and a switch coupled between said memory cell array and a supply voltage, said switch controllably connecting and disconnecting said memory cell array and said supply voltage in response to a selected state of a first control signal and a second control signal generated by said microprocessor wherein said first control signal and said second control signal may independently vary.

2. The memory, as set forth in claim 1, further comprising a logic circuit receiving said first control signal as a standby control signal and said second control signal as a data retention control signal, an output of said logic circuit controlling said switch in response to selected states of said standby and data retention control signals.

3. The memory, as set forth in claim 1, further comprising a logic circuit coupled to said switch and receiving said first acontrol signal and second control signal, an output of said logic circuit turning on said switch in response to said first control signal indicating not standby or said second control signal indicating data retention.

4. The memory, as set forth in claim 3, wherein said logic circuit includes a NOR gate receiving said first and second control signals at its input.

5. The memory, as set forth in claim 1, wherein said memory cell array is further coupled to a second supply voltage through a second switch, said second switch controllably connecting and disconnecting said memory cell array and said second supply voltage in response to selected states of said second control signal generated by said mircoporcessor.

6. The memory, as set forth in claim 5, wherein said first and second supply voltages supply the same supply voltage level.

7. The memory, as set forth in claim 5, wherein said first and second supply voltages supply different supply voltage levels.

8. The memory, as set forth in claim 5, further comprising a second logic circuit coupled to said second switch and receiving said first control signal and a second control signal, an output of said second logic circuit turning on said second switch in response to said selected state indicating standby.

9. The memory, as set forth in claim 1, further comprising:

periphery circuitry coupled to said memory cell array; and a second switch coupled between said periphery circuitry and said supply voltage responsive to a selected state of said control signal and a second control signal generated by said microprocessor.

10. A memory comprising:

a plurality of memory blocks;

a switch coupled between at least one of said memory blocks and a supply voltage, said switch disconnecting said at least one memory block from said supply voltage in response to a selected state of a control signal;

a wordline selection circuit;

a plurality of global wordlines driving selected wordline selection circuits;

said wordline selection circuit coupled to said plurality of global wordlines generating a plurality of block wordlines coupled to said memory blocks in response to a respective one of a plurality of block selection singals.

11. The memory, as set forth in claim 10, wherein each said memory block comprises:

a periphery circuitry; and a switch coupled between said periphery circuitry and said supply voltage responsive to a selected state of a second control signal.

12. The memory, as set forth in claim 10, wherein each said wordline selection circuit includes:

a NAND gate receiving one of said global wordlines and a respective one of said block selection signals; and an inverter coupled to an output of said NAND gate, an output of which generates a respective one of said block wordline.

13. The memory, as set forth in claim 10, wherein said switch includes a p-channel transistor being gated by said control signal.

14. A computer system, comprising:

a memory device having at least one memory cell array;

a microprocessor coupled to said memory device; and a switch coupled between selected ones of said at least one memory cell array and a supply voltage, said switch disconnecting selected ones of said memory cell array from said supply voltage in response to a predetermined state of standby and data retention control signals for said memory cell array determined by said microprocessor wherein said standby and data retention control signals may independently vary.

15. The computer system, as set forth in claim 14, wherein said memory device further comprises:

periphery circuitry; and a switch coupled between said periphery circuitry and said supply voltage, said switch disconnecting said periphery circuitry from said supply voltage in response to another predetermined state of said memory cell array.

16. The computer system, as set forth in claim 14, wherein said memory device further comprises:

a plurality of memory cell arrays;

dedicated periphery circuitry coupled to each of said memory cell array; and a switch coupled between each said periphery circuitry and said supply voltage, said switches connecting and disconnecting selected ones of said periphery circuitry and said supply voltage in response to the predetermined states of said memory cell arrays.

17. The computer system, as set forth in claim 14, wherein said memory device further comprises:

a plurality of memory cell arrays;

a bus coupled to said microprocessor and said plurality of memory cell arrays;

switches controllably connecting and disconnecting a number of selected ones of said plurality of memory cell arrays and said supply voltage; and said microprocessor generating an enable address delivered to said memory cell arrays via said bus, said enable address controlling said switches in response to memory usage requirements.

18. The computer system, as set forth in claim 14, further comprising a second switch coupled between said at least one memory cell array and a second supply voltage, said memory cell array being connected to said supply voltage in response to a first predetermined state of said memory cell array, and being connected to said second supply voltage in response to another predetermined state of said memory cell array.

19. The computer system, as set forth in claim 14, further comprising a logic circuit receiving a standby control signal and a data retention control signal, an output of said logic circuit controlling said switch in response to selected states of said standby and data retention control signal generated by said microprocessor.

20. The computer system, as set forth in claim 14, further comprising a logic circuit receiving a first and second control signal, an output of said logic circuit turning on said switch in response to said first control signal indicating not standby or said second control signal indicating data retention as determined by said microprocessor.

21. The computer system, as set forth in claim 14, wherein said memory cell array includes:

a plurality of memory blocks; and a switch coupled between each said memory block and said power supply, said switches disconnecting respective memory blocks from said power supply in response to a selected state of a control signal generated by said microprocessor.

22. The memory, as set forth in claim 14, wherein said memory cell array includes:

a plurality of memory blocks;

a switch coupled between each said memory block and said power supply, said switches disconnecting respective memory blocks from said power supply in response to selected states of a standby control signal and a data retention control signal generated by said microprocessor;

a plurality of global wordlines driving selected rows of memory cells of said memory cell array;

wordline selection circuits coupled to said plurality, of global wordlines generating a plurality of block wordlines coupled to respective memory blocks in response to a plurality of respective block selection signals generated by said microprocessor.

23. A method for reducing power consumption and leakage current in a memory cell array in a computer system, compirising the steps of:

dividing said memory cell array into a plurality of memory blocks; and determining memory use, both standby for active blocks and data retention for blocks with data to be retained, in terms of the number of memory blocks, and selectively providing power to those memory blocks needed.

24. The method, as set forth in claim 23, further comprising the steps of:

determining whether data retention is required for the memory blocks;

generating a standby signal for each of said plurality of memory blocks indicative of an active/inactive status of said respective memory blocks;

generating a data retention signal for each of said plurality of memory blocks indicative of whether data stored in said respective memory blocks are to be retained; and selectively providing power to those memory blocks having a standby signal indicating an active status, or a data retention signal indicating data retention required.

25. The method, as set forth in claim 23, further comprising the step of selectively providing power to a minimal number of memory blocks upon power up.

26. The method, as set forth in claim 23, further comprising the step of generating block wordlines for driving selected rows of selected memory blocks.

* * * * *